United States Patent
Wu

Patent Number: 6,081,032
Date of Patent: *Jun. 27, 2000

[54] DUAL DAMASCENE MULTI-LEVEL METALLIZATION AND INTERCONNECTION STRUCTURE

[75] Inventor: Shye-Lin Wu, Hsinchu, Taiwan

[73] Assignee: Texas Instruments - Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/023,260

[22] Filed: Feb. 13, 1998

[51] Int. Cl.⁷ .................................................. H01L 23/535
[52] U.S. Cl. ........................................ 257/752; 257/773
[58] Field of Search ............................ 257/752, 773–776

[56] References Cited

U.S. PATENT DOCUMENTS

| | | | |
|---|---|---|---|
| 5,382,545 | 1/1995 | Hong | 437/195 |
| 5,404,046 | 4/1995 | Matsumoto et al. | 257/773 |
| 5,514,910 | 5/1996 | Koyama | 257/752 |
| 5,598,027 | 1/1997 | Matsuura . | |
| 5,602,423 | 2/1997 | Jain | 257/763 |
| 5,616,959 | 4/1997 | Jeng | 257/752 |
| 5,659,201 | 8/1997 | Wollesen | 257/741 |
| 5,675,187 | 10/1997 | Numata et al. | 257/773 |
| 5,691,566 | 11/1997 | Sturdivant | 257/775 |
| 5,693,563 | 12/1997 | Teong | 437/190 |
| 5,705,849 | 1/1998 | Zheng et al. | 257/751 |
| 5,760,429 | 6/1998 | Yano et al. | 257/211 |
| 5,767,012 | 6/1998 | Fulford, Jr. et al. | 438/622 |
| 5,808,365 | 9/1998 | Mori | 257/775 |
| 5,824,599 | 10/1998 | Schacham-Diamand et al. | 438/678 |

OTHER PUBLICATIONS

David Butler "Options for multilevel metallization" in Solid State Technology p. s7, Mar., 1996.

K. Kikuta et al. "Multilevel Planarized–Trench–Aluminum (PTA) Interconnection using Reflow Sputtering and Chemical Mechanical Polishing" (in IEDM Tech. Dig. p. 285, 1993).

R.V. Joshi "A New Damascene Structure for Submicrometer Interconnect Wiring" in IEEE Electron Device Letters, vol. 14, No. 3, 1993.

*Primary Examiner*—David Hardy
*Attorney, Agent, or Firm*—Harness, Dickey & Pierce, P.L.C.

[57] ABSTRACT

An interconnection structure is disclosed. The interconnection structure has a dielectric layer over a semiconductor substrate. The interconnection structure also has first conductive connections within the dielectric layer. Second conductive connections are located over first conductive connections within the dielectric layer for connecting the first conductive connections. More layers of the interconnection structure can be stacked with the same structure to form multi-level connections.

19 Claims, 4 Drawing Sheets

DUAL DAMASCENE MULTI-LEVEL METALLIZATION AND INTERCONNECTION STRUCTURE

FIELD OF THE INVENTION

The present invention relates to semiconductor fabrication, and more specifically to a method of metallization. A dual damascene process is provided for forming a multi-level metallization and interconnection structure.

BACKGROUND OF THE INVENTION

The semiconductor has been developing for the four decades since the birth of the first semiconductor device. For performing more complicated operations at a higher speed, more and more devices and connections are formed within a circuit. The density of semiconductor chips is raised to include more devices and functions in a single chip. In the integrated circuit, a great number of devices and connections are fabricated on a single chip. Various kinds of devices like transistors, resistors, and capacitors are formed together. Each device must operate with good connections to provide interaction between each other for completing the functionality, especially under the higher and higher packing density of the integrated circuits.

Connections must be formed in addition to these densely arranged devices for finishing a circuit to perform operations. In the semiconductor manufacturing process, metallization is a process to form connections between devices. With more and more devices on a chip with high integrity, the early stage single layer metallization process had been improved to form multiple layers of connections. Two layers, three layers, or even four layers of connections are formed in present applications. With the sub-micrometer or even smaller devices, the metallization process is challenged with forming narrower conductive lines with compromising resistance. More layers of connections must be formed with low misalignment and good yield.

For fabricating high density devices like ULSI (ultra-large scale integration) devices, metallization with small pitch and a multilevel-structure becomes necessary for providing high packing density with reliable functionality. D. Butler disclosed an analysis of several metallization techniques in the article "Options for Multilevel Metallization" in Solid State Technology p. s7, March, 1996. He disclosed that fundamental limitations in the performance of established metallization technologies become increasingly apparent for smaller feature size of the devices. Higher packing density has led to additional levels of metal interconnects. It is possible to use up to four to six levels of interconnects in the design rule for logic devices with 0.35 micrometer feature size. The metallization process needs to be improved for providing connections with higher operating speeds, reduced RC delay, and increased reliability. A comparison between several metallization technologies including aluminum reflow, tungsten plug, and forcefill aluminum are provided in his work.

In the conventional planarization process for metallization, several problems hindered the application for high integrity circuits. Problems like the interlevel dielectric gap fill and subsequent local or global planarization are difficult to overcome even with the chemical-mechanical polishing (CMP) technology. In the work of K. Kikuta et al. in "Multilevel Planarized-Trench-Aluminum (PTA) Interconnection Using Reflow Sputtering and Chemical Mechanical Polishing" (in IEDM Tech. Dig. P. 285, 1993), these challenges are addressed. The electrode pitch has become smaller as the packing density of devices increases. Multilevel-metallization has become necessary for densely arranged devices. Dielectric planarization has been developed for high density devices with multilevel interconnection. The conventional planarization problems of interlevel dielectric gap fill and subsequent local or global planarization are also emphasized. A metal planarization for achieving borderless or self-aligned contacts with minimum line pitch is also disclosed in the work.

In recent times, the damascene technology has been reported to achieve the metal planarization with self-aligned contact and minimum line pitch. A damascene structure to form high-density interconnect wiring is presented by R. V. Joshi in the work "A New Damascene Structure for Submicrometer Interconnect Wiring" in IEEE Electron Device Letters, vol. 14, No. 3, 1993. The structure results in improved short yields, lower sheet resistances, comparable contact/via resistances, and shows excellent filling of high-aspect-ratio long lines with high copper content compared to traditionally used wiring fabricated by reactively ion etching (RIE) of Ti/Al—Cu/Ti/TiN.

However, for multilevel-metallization, in conventional damascene technology it is also difficult to control the pattern misalignment problem. In U.S. Pat. No. 5,598,027 to M. Matsuura for "Semiconductor Device and Method of Fabricating the same", the pattern misregistration in forming a multilayer interconnection structure is illustrated. The problem causes circuit short and element damages and thus yield of the process is reduced. For fabricating integrated circuits with high packing density, a metallization process solving the problem of planarization and misalignment must be developed.

SUMMARY OF THE INVENTION

A process of metallization and a structure of interconnections are disclosed in the present invention. A multilevel metallization and interconnection structure with dual damascene characteristics are provided. Multilevel metal planarization can be achieved. The control of the process to increase accuracy and yield can be enhanced. The low resistance characteristics of the connections can be maintained and the aligning tolerance in forming connections can be raised.

An interconnection structure is disclosed. The interconnection structure has a dielectric layer over a semiconductor substrate. The interconnection structure also has first conductive connections within the dielectric layer. Second conductive connections are located over first conductive connections within the dielectric layer for connecting the first conductive connections. The first conductive connections have conductive couplings to junctions, gates, or conductors on the semiconductor substrate. The second conductive connections can be designed to have wider line width than the first conductive connections. The first conductive connections and the second conductive connections thus can form dual damascene structure in the dielectric layer. More layers of the interconnection structure can be stacked with the same structure to form multi-level connections.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposes a dual damascene process for multi-level metallization and interconnection structure. The metallization process can be improved with the method disclosed for providing interconnections between devices with fewer defects. The effect of misalignment can be reduced. Multilevel metal planarization is achieved. The proposed process is more controllable than the conventional damascene during the semiconductor manufacturing process. The method for forming a multilayer connections is described as follows.

Figure 1:
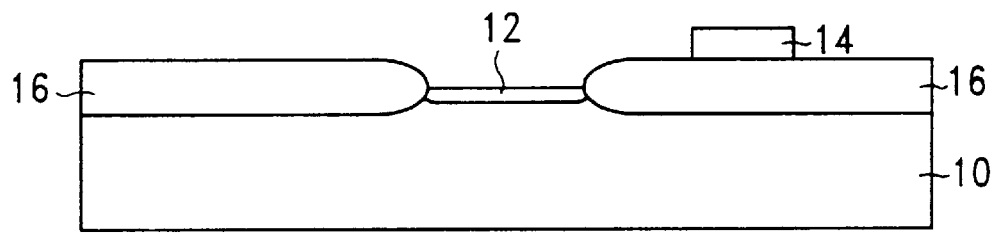
FIG. 1 illustrates a cross-sectional view of forming a semiconductor substrate in the present invention.

Referring to FIG. 1, a cross-sectional view of a semiconductor 10 is illustrated. The semiconductor substrate 10 had been finished with the forming of operational devices like transistors, resistors, and capacitors. The cross-sectional view illustrates only the junction region 12 and a conductor line 14 cross over the isolation region 16. The whole structure of transistors is not shown with the cross-section. Without limiting the scope of the invention, the cross-section is illustrated only for introducing the metallization method in the present invention.

Figure 2:
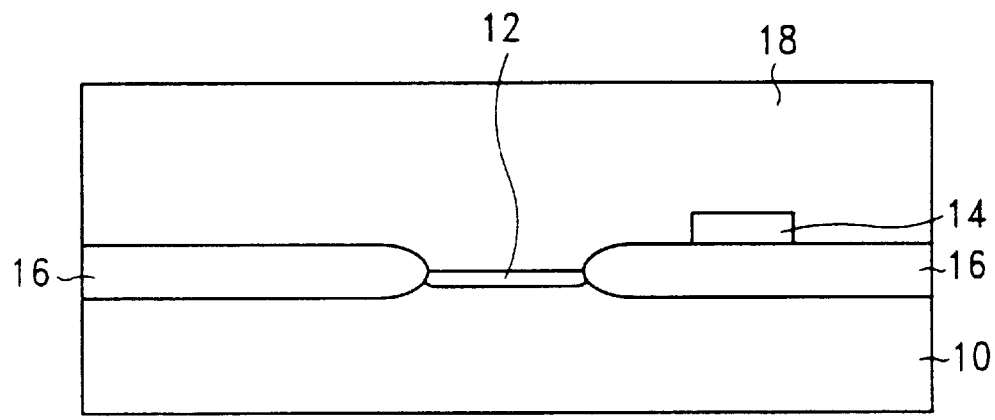
FIG. 2 illustrates a cross-sectional view of forming a dielectric layer on the semiconductor substrate in the present invention.

Referring to FIG. 2, a dielectric layer 18 is then formed over the semiconductor substrate 10. The dielectric layer 18 is formed by a chemical vapor deposition (CVD) process. The dielectric layer 18 is used to provide individual contact paths to independent junctions, gates, or pads and form effective insulation between each path. A variety choices in the dielectric materials like oxide or nitride can be used. The oxide like a TEOS-oxide (tetra-ethyl-ortho-silicate oxide) can be used. Other dielectric materials like BPSG (borophosphosilicate glass), PSG (phosphosilicate Glass), BSG (borosilicate glass), etc. can also be used alternatively.

Figure 3:
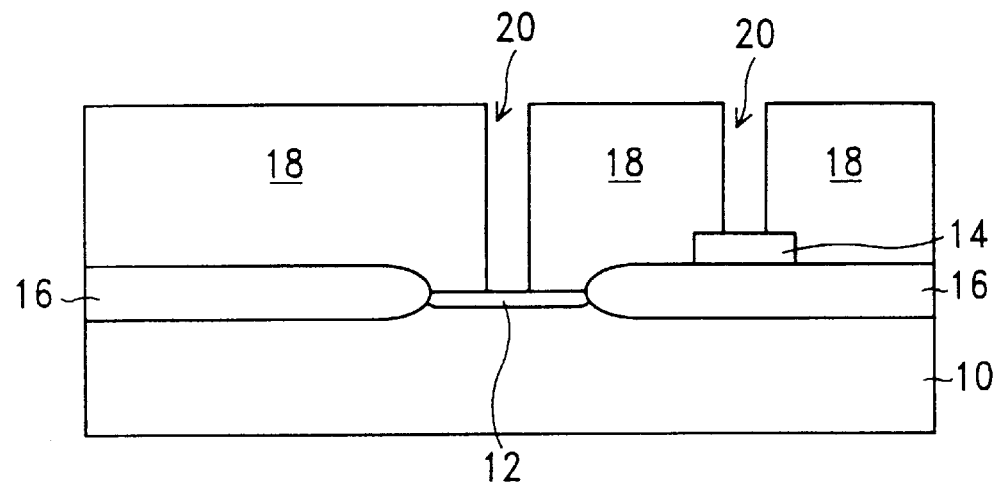
FIG. 3 illustrates a cross-sectional view of removing a portion of the dielectric layer to form contact holes in the present invention.

A portion of the dielectric layer 18 is removed to form contact holes 20, as shown in FIG. 3. A lithography process is used to define the regions to form connections to the independent regions, conductors, or pads on the semiconductor substrate 10. An etching process, especially the dry etching process like a reactive ion etching (RIE) can be used to etch the dielectric layer 18 with a defined pattern. The contact holes 20 are etched to the depth of forming paths for conductive connections to the junction 12 and conducting line 14.

Figure 4:
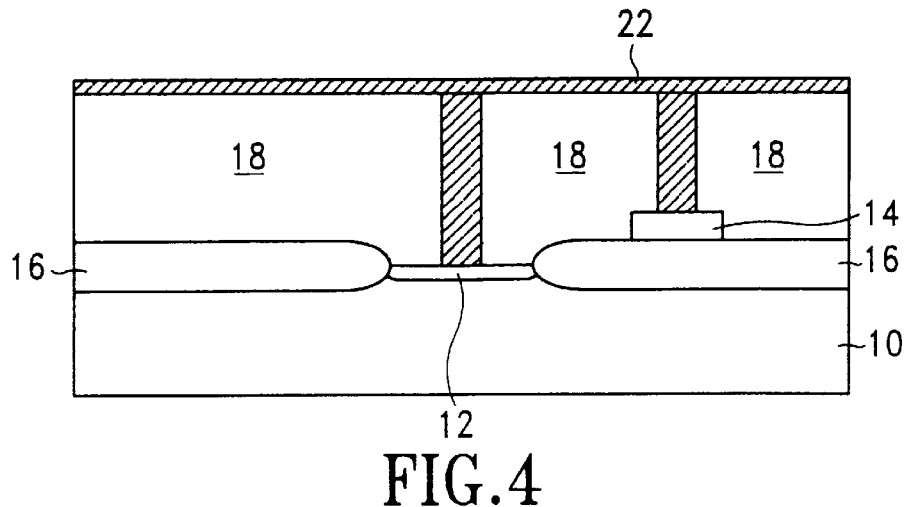
FIG. 4 illustrates a cross-sectional view of forming a first conductive layer within the contact holes and over the dielectric layer in the present invention.

Followed with the formation of the contact holes 20, a first conductive layer 22 is formed within the contact holes 20 and over the dielectric layer 18, as shown in FIG. 4. A variety of conductive materials can be used for the first conductive layer 22. In the present semiconductor manufacturing process, materials like tungsten, tungsten silicide, aluminum, and doped polysilicon can be used. The method of forming the first conductive layer 22 like sputtering or chemical vapor deposition can be employed for different materials. The formation of the first conductive layer 22 provided conductive paths to the junction 12 and conducting line 14.

Figure 5:
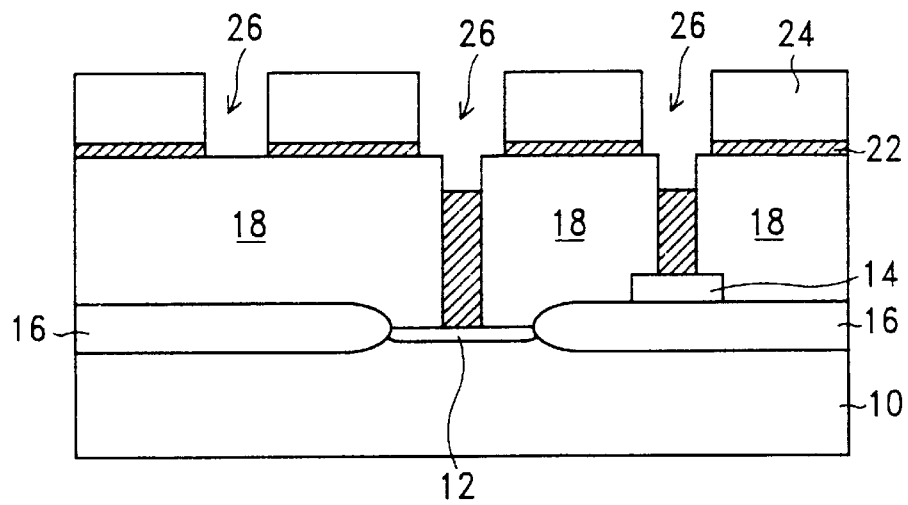
FIG. 5 illustrates a cross-sectional view of removing a portion of the first conductive layer to define a contact pattern in the present invention.

Referring to FIG. 5, a portion of the first conductive layer 22 is then removed to define a contact pattern 26. The contact pattern 26 is defined with the region to form the designed connections between the independent paths formed by the first conductive layer 22 in the contact holes 20. In general, the definition of the contact pattern 26 can be achieved by a lithography process and an etching process. A photoresist layer 24 can be formed over the first conductive layer 22 to be exposed with a designed pattern on a photo mask. An etching process like a reactive ion etching is followed to form the contact pattern 26 and the photoresist layer 24 is then removed. The etching process is performed to etch the first conductive layer 22 to the depth deeper than the top surface of the dielectric layer 18. Thus the contact pattern 26 can provide spaces in the dielectric layer 18 for the forming of a second conductive layer within by a process which will be performed later. The width of the contact pattern 26 can be defined wider than the conductive paths formed by the first conductive layer 22. With the wider contact pattern 26 for forming a conductive layer later, the tolerance to misalignment can be raised and the resistance of the connections can be reduced.

Figure 6A:
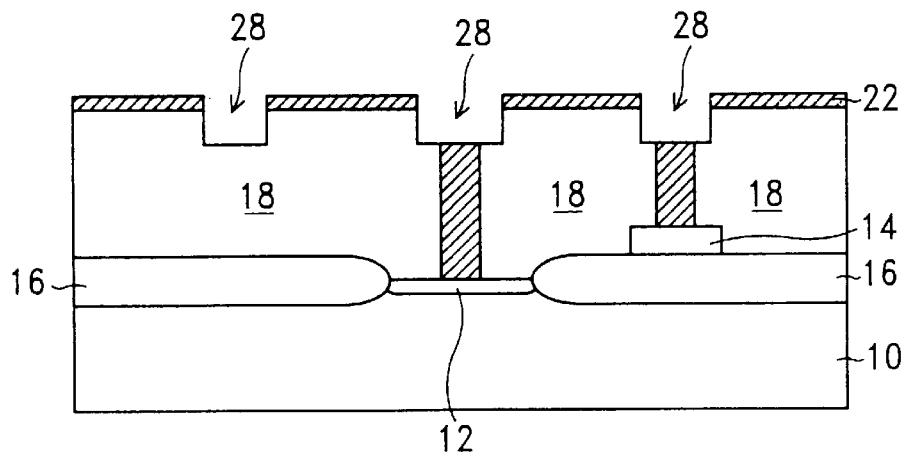
FIG. 6a illustrates a cross-sectional view of removing a portion of the dielectric layer to form openings within the dielectric layer by the contact pattern in the present invention.
Figure 6B:
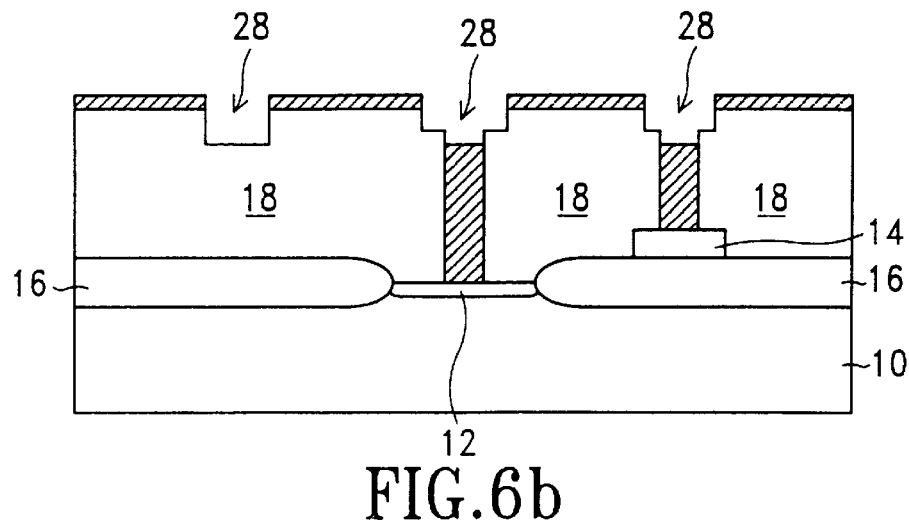
FIG. 6b illustrates a cross-sectional view of under etching a portion of the dielectric layer to form openings within the dielectric layer and over the first conductive layer in the present invention.
Figure 6C:
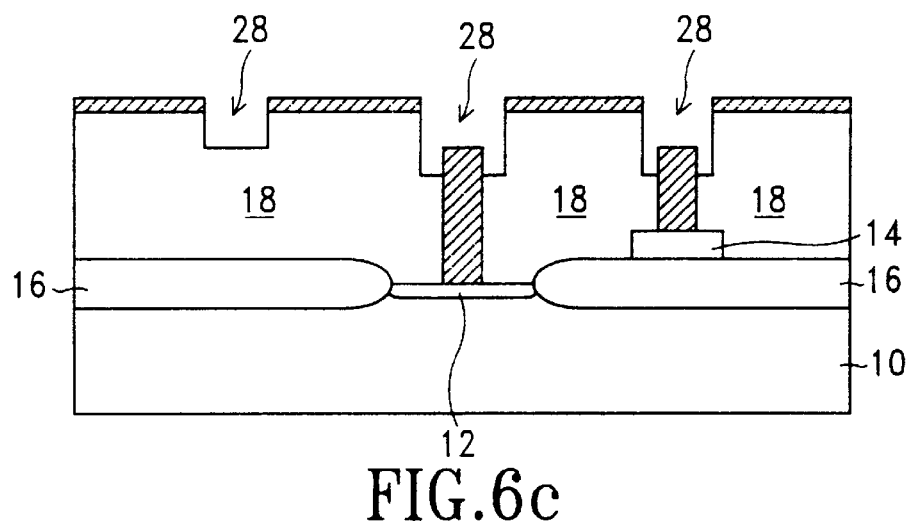
FIG. 6c illustrates a cross-sectional view of over etching a portion of the dielectric layer to form openings within the dielectric layer and over the first conductive layer in the present invention.

A portion of the dielectric layer 18 is removed using the first conductive layer 22 as a mask as shown in FIG. 6a. Openings 28 are formed within the dielectric layer 18 and over the first conductive layer. Since the first conductive layer 22 acts as a mask in forming a damascene structure, the accompanying disadvantages of using conventional lithography process can be greatly reduced. The conventional lithography process needed for forming the structure is eliminated and the efforts and cost can be reduced. The removing of a portion of the dielectric layer 18 can be performed with a reactive ion etching process. The etching can be performed to the depth near the height of the top surface of the first conductive layer 22 in the dielectric layer 18. The tolerance in the etching depth is high. The under etching as shown in FIG. 6b or the over etching as shown in FIG. 6c are all acceptable cases without influences on the functionality of the integrated circuits. Thus the etching process can be easily controlled under the large process window of the etching depth. The remaining first conductive connections are covered with the dielectric layer 18 at the sidewalls.

Figure 7:
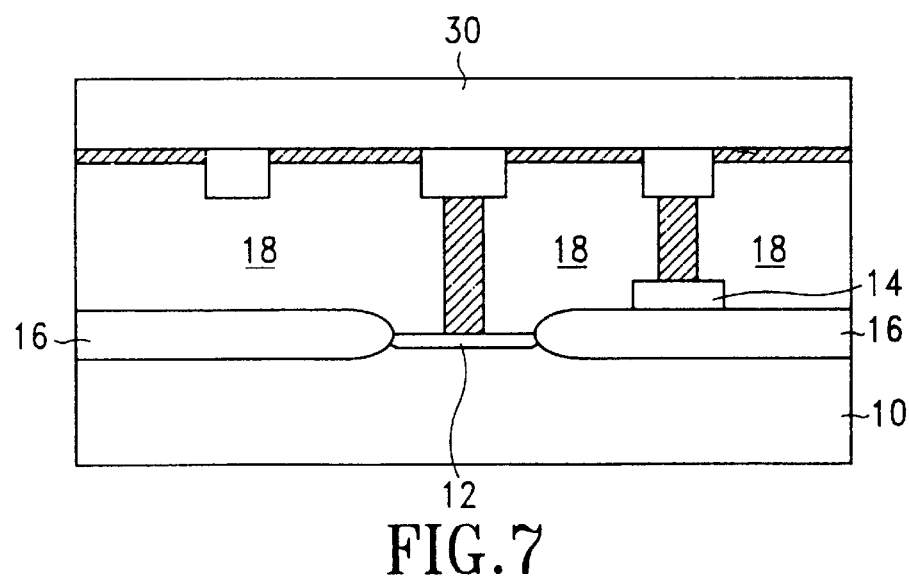
FIG. 7 illustrates a cross-sectional view of forming a second conductive layer within the openings and over the first conductive layer in the present invention.
Figure 8:
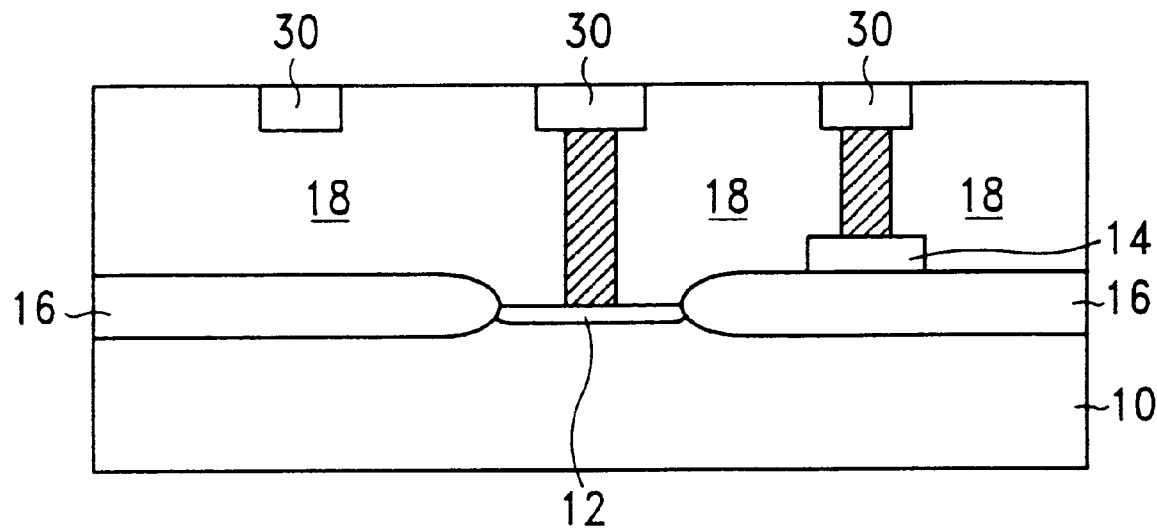
FIG. 8 illustrates a cross-sectional view of removing a portion of the second conductive layer and the first conductive layer to planarize to the dielectric layer in the present invention.

Referring to FIG. 7, a second conductive layer 30 is then formed within the openings 28 and over the first conductive layer 22 to make connections between the paths. The second conductive layer 30 can be composed of materials like tungsten, tungsten silicide, titanium silicide, aluminum, etc. The formation method like sputtering or chemical vapor deposition can be employed for different materials. A portion of the second conductive layer 30 and of the first conductive layer 22 is removed to planarize to the dielectric layer 18, as shown in FIG. 8. Therefore, the remaining second conductive connections are covered with the dielectric layer 18 at the sidewalls. Both the first conductive connections and the second conductive connections are covered with the same single dielectric layer 18 at the sidewalls. The process can be performed with a planarization process like a chemical mechanical polishing to have a planar top surface of the dielectric layer 18. Thus more metallization process can be formed for finishing the whole chip connection with multilayer structure.

An interconnection structure for a connecting layer is formed. The interconnection structure has a dielectric layer 18 over the semiconductor substrate 10. The interconnection structure also has a first conductive connections 22 within the dielectric layer 18. Second conductive connections 30 are located over first conductive connections 22 within the dielectric layer 18 for connecting the first conductive connections 22. The first conductive connections 22 have conductive couplings to junctions 12, gates, or conductors 14 on the semiconductor substrate 10. The second conductive connections 30 can be designed to have wider line width than the first conductive connections 22. The first conductive connections 22 and the second conductive connections 30 form dual damascene structure in the dielectric layer 18, as shown in FIG. 8. Thus the low resistance characteristics of the connections can be maintained and the aligning tolerance in forming connections can be raised.

Figure 9:
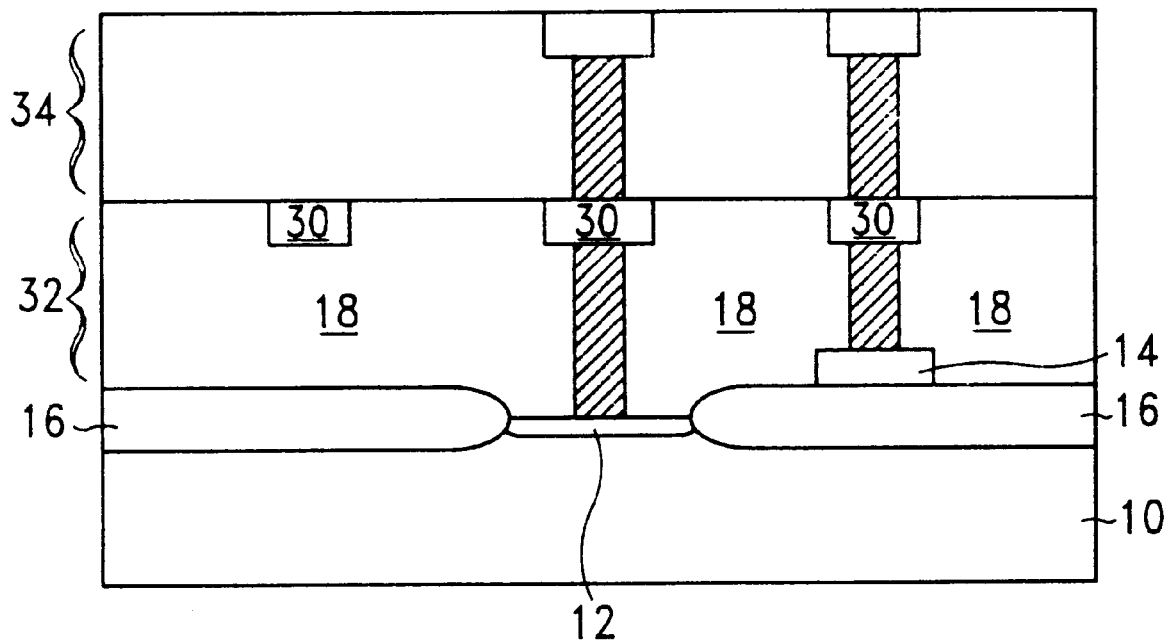
FIG. 9 illustrates a cross-sectional view of the semiconductor with another metallization process in the present invention performed.

After the first layer of interconnection structure 32 is formed, the same serious steps as described above can be performed to form a second layer of interconnection structure 34, as shown in FIG. 9. With the aforementioned process, more connecting layers can be formed to create a multilayer connections structure with up to six or more layers.

The dual damascene process in the present invention forms a multilevel metallization and interconnection structure. The process of forming a dual damascene structure is greatly simplified by defining the contact pattern 26 on the first conductive layer 22 and using it as a hard mask for etching the openings 28. Thus the conventional process of using a photoresist layer or a buffer layer can be replaced. The alignment problem can be solved. As mentioned above, the tolerance to misalignment is raised by the process in the present invention. The process window to the etching process is increased and thus the process can be well controlled. The proposed process is more controllable than the conventional damascene technology. The multilevel metal planarization could be achieved at the same time.

With the method and the structure of the present invention, the disadvantages of using photoresist or dielectric material for forming the damascene structure can be reduced. The residue problem of the photoresist or the dielectric are often encountered with the conventional method. Moreover, the problems are enhanced especially for smaller contact holes or contacts holes with a high aspect ratio. The photoresist or the dielectric residues in small or high aspect ratio contact holes are hard to clean entirely and the selectivity problem during removal must also be considered. The present invention is free of the residue problem. Thus the yield and the throughput of the semiconductor fabrication process are raised.

As is understood by a person skilled in the art, the foregoing descriptions of the preferred embodiment of the present invention are illustrations of the present invention rather than limitations thereon. They are intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An interconnection precursor structure over a semiconductor substrate, said interconnection precursor structure comprising of:

a single dielectric layer over said semiconductor substrate;

first conductive layer having:

vertical connections within said single dielectric layer, said single dielectric layer covering around sidewalls of said vertical connections; and horizontal connections overlying said single dielectric layer, at least a portion of said horizontal connections being located on a position other than said vertical connections located; and second conductive connections on said single dielectric layer, said second conductive comprising a first portion formed partially within said single dielectric layer, said first portion of said second conductive connections being located on positions other than said horizontal connections located, said first portion of said second conductive connections comprising portions located on said vertical connections, said single dielectric layer covering around sidewalls of said second conductive connections.

2. The interconnection precursor structure of claim 1, wherein said vertical connections communicate to underlying junction regions or gate regions on said semiconductor substrate.

3. The interconnection precursor structure of claim 1 further comprising a conductor underlying and communicating to a portion of said vertical connections, said conductor located within said single dielectric layer covering around sidewalls of said conductor.

4. The interconnection precursor structure of claim 1, wherein said vertical connections and said first portion of said second conductive connections form dual damascene structures in said single dielectric layer.

5. The interconnection precursor structure of claim 1, wherein said first portion of said second conductive connections have wider line widths than said vertical connections.

6. The interconnection precursor structure of claim 1, wherein said single dielectric layer is selected from the group consisting of TEOS-oxide (tetraethyl-ortho-silicate oxide), BPSG (borophosphosilicate glass), PSG (phosphosilicate glass), BSG (borosilicate glass), and silicon nitride.

7. The interconnection precursor structure of claim 1, wherein said first conductive layer is selected from the group consisting of tungsten, tungsten silicide, aluminum, and doped polysilicon.

8. The interconnection precursor structure of claim 1, wherein said second conductive connections are selected from the group consisting of tungsten, tungsten silicide, titanium silicide, and aluminum.

9. The interconnection precursor structure of claim 1, wherein said interconnection structure is stacked with more layers in the same structure of said interconnection structure to form multi-level connection.

10. The interconnection precursor structure of claim 1, wherein said first portion of said second conductive connections and said horizontal connections have top surfaces aligned at a same horizontal level.

11. An interconnection precursor structure over a semiconductor substrate, said interconnection precursor structure comprising of:
- a single dielectric layer over said semiconductor substrate;
- first conductive layer having:
  - vertical connections within said single dielectric layer, said single dielectric layer covering around sidewalls of said vertical connections; and
  - horizontal connections overlying said single dielectric layer for, at least a portion of said horizontal connections being located on a position other than said vertical connections located; and
- second conductive connections on said single dielectric layer, said second conductive comprising a first portion formed partially within said single dielectric layer, said first portion of said second conductive connections being located on positions other than said horizontal connections located, said first portion of said second conductive connections comprising portions located on said vertical connections, said single dielectric layer covering around sidewalls of said second conductive connections, said first portion of said second conductive connections and said horizontal connections having top surfaces aligned at a same horizontal level.

12. The interconnection precursor structure of claim 11, wherein said vertical connections communicate to underlying junction regions or gate regions on said semiconductor substrate.

13. The interconnections precursor structure of claim 11 further comprising a conductor underlying and communicating to a portion of said vertical connections, said conductor located within said single dielectric layer, said single dielectric layer covering around sidewalls of said conductor.

14. The interconnection precursor structure of claim 11, wherein said vertical connections and said first portion of said second conductive connections form dual damascene structures in said single dielectric layer.

15. The interconnection precursor structure of claim 11, wherein said first portion of said second conductive connections have wider line widths than said vertical connections.

16. The interconnection precursor structure of claim 11, wherein said single dielectric layer is selected from the group consisting of TEOS-oxide (tetraethyl-ortho-silicate oxide), BSPG (borophosphosilicate glass), PSG (phosphosilicate glass), BSG (borosilicate glass), and silicon nitride.

17. The interconnection precursor structure of claim 11, wherein said first conductive layer is selected from the group consisting of tungsten, tungsten silicide, aluminum, and doped polysilicon.

18. The interconnection precursor structure of claim 11, wherein said second conductive connections are selected from the group consisting of tungsten, tungsten silicide, titanium silicide, and aluminum.

19. The interconnection precursor structure of claim 11, wherein said interconnection structure is stacked with more layers in the same structure of said interconnection structure to form multi-level connections.

* * * * *